(12) United States Patent
Dong et al.

(10) Patent No.: US 7,125,784 B2
(45) Date of Patent: Oct. 24, 2006

(54) METHOD OF FORMING ISOLATION FILM IN SEMICONDUCTOR DEVICE

(75) Inventors: Cha Deok Dong, Kyungki-Do (KR); Il Keoun Han, Kyungki-Do (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/876,333

(22) Filed: Jun. 24, 2004

(65) Prior Publication Data

US 2005/0130433 A1    Jun. 16, 2005

(30) Foreign Application Priority Data

Dec. 11, 2003   (KR) ................. 10-2003-0089983

(51) Int. Cl.
 *H01L 21/762* (2006.01)
(52) U.S. Cl. ............... 438/424; 438/906; 257/E21.228; 134/2
(58) Field of Classification Search ............. 134/2; 438/424, 906, 753, 974, 263, 264; 257/E21.228
See application file for complete search history.

(56) References Cited

U.S. PATENT DOCUMENTS

| | | | |
|---|---|---|---|
| 6,034,393 A * | 3/2000 | Sakamoto et al. ............ 257/315 |
| 6,326,282 B1 * | 12/2001 | Park et al. ................... 438/424 |
| 6,759,708 B1 * | 7/2004 | Hurley et al. ................ 257/315 |
| 2001/0006246 A1 * | 7/2001 | Kwag et al. ................. 257/522 |
| 2001/0052626 A1 * | 12/2001 | Lo ............................... 257/412 |
| 2002/0055217 A1 * | 5/2002 | Kanamori .................... 438/221 |
| 2002/0081441 A1 * | 6/2002 | Desu et al. ................... 428/451 |
| 2002/0102811 A1 * | 8/2002 | Farrow et al. ............... 438/401 |
| 2002/0112740 A1 * | 8/2002 | DeYoung et al. ............... 134/3 |
| 2004/0072431 A1 * | 4/2004 | Shin ............................ 438/689 |
| 2005/0142765 A1 * | 6/2005 | Joo ............................. 438/264 |
| 2005/0233524 A1 * | 10/2005 | Lee ............................. 438/264 |

FOREIGN PATENT DOCUMENTS

KR    2000-0027010 A    5/2000

* cited by examiner

*Primary Examiner*—George Fourson
(74) *Attorney, Agent, or Firm*—Marshall, Gerstein & Borun LLP

(57) ABSTRACT

The present invention relates to a method for forming an isolation film in a semiconductor device. After a trench for isolation is formed, a polymer film is stripped by a post cleaning process using BFN. A pre-treatment cleaning process using only SC-1 is performed and a sidewall oxidization process is then carried out. It is therefore possible to improve fail of the roughness of the trench sidewall and to easily strip polymer. Furthermore, since a conventional PET process is omitted, an isolation film manufacturing process is simplified. It is also possible to prohibit out-diffusion of dopants injected into a semiconductor substrate through a pre-treatment cleaning process using CLN N before the sidewall oxidization process. Incidentally, by forming a slope at the top corner of the trench, it is possible to prevent a gate oxide film thinning phenomenon that the gate oxide film thinner than a desired thickness is deposited at the trench corner. It is also possible to improve electrical properties of a device since an active region as much as a target critical dimension is secured.

10 Claims, 7 Drawing Sheets depth

METHOD OF FORMING ISOLATION FILM IN SEMICONDUCTOR DEVICE

This application relies for priority upon Korean Patent Application No. 2003-0089983 filed on Dec. 11, 2003, the contents of which are herein incorporated by reference in their entirety.

BACKGROUND

1. Field of the Invention

The present invention relates to a method for forming an isolation film in a semiconductor device, and more specifically, to a method for forming a self-aligned shallow trench pattern in a NAND flash device.

2. Discussion of Related Art

Generally, in order to form a transistor on a semiconductor substrate, an active region that is electrically electrified and an isolation region for preventing electrical electrification and isolating elements are formed in the semiconductor substrate. A portion of the semiconductor substrate in the isolation region is etched and is then filled to form an isolation film.

Conventionally, after the semiconductor substrate in the isolation region is etched, a post etch treatment (PET) process for a thin etch of a trench sidewall is implemented. At this time, an abnormal layer is formed due to polymer of a carbon series generated from the PET process, thus resulting in uneven oxidization in a subsequent oxidization process.

FIG. 1A and FIG. 1B are TEM photographs for explaining sidewall damage by a conventional process.

Referring to FIG. 1A and FIG. 1B, after a trench for isolation is formed, if a post cleaning process is performed, the semiconductor substrate exposed by the etch process is damaged. Damage of the semiconductor substrate within the trench adversely affects the properties of the isolation film.

FIG. 2 is a TEM photograph showing that the abnormal layer of the carbon series is formed after the PET process in the related art.

FIG. 3 is a TEM photograph for explaining the disparity of a sidewall oxide film in the related art.

FIG. 4 shows a TEM EDS analysis table for the sidewall oxide film in the related art.

Referring to FIG. 2 to FIG. 4, if a trench is formed through an isolation etch according to a conventional isolation process and a PET process is performed, an abnormal layer of a carbon series is formed within the trench.

If the inside of the trench wherein the abnormal layer is formed is experienced by a sidewall oxidization process, a very uneven sidewall oxide film is formed. Accordingly, there occurs a problem that a target trench shape is difficult to form. It is also impossible to reduce damage due to the etch.

SUMMARY OF THE INVENTION

The present invention is contrived to solve the aforementioned problems, and an object of the present invention is to provide a method for forming an isolation film in a semiconductor device wherein the roughness of a trench sidewall is improved by performing a predetermined cleaning process after a trench for isolation is etched and a uniform sidewall oxide film is formed as a PET process is omitted.

According to a preferred embodiment of the present invention, there is provided a method for forming an isolation film in a semiconductor device, comprising the steps of: sequentially forming a tunnel oxide film, a conductive film, and a hard mask film on a semiconductor substrate, forming a photoresist pattern through which an isolation region is opened on the hard mask film; forming a trench by etching the hard mask film, the conductive film, the tunnel oxide film and the semiconductor substrate by performing an etch process using the photoresist pattern as an etch mask; stripping the photoresist pattern and then performing a first cleaning process for stripping the polymer film, which is generated during the etch process for forming the trench, on a sidewall of the trench to improve the stabilization of the roughness of the sidewall; performing a second cleaning process to uniformly form a sidewall oxide film through subsequent processes after the first cleaning process; performing a tunnel oxide film, conductive film and within the trench; and depositing a field oxide film on the entire structure, performing a polishing process using the hard mask film as a stop layer, and then stripping the hard mask film to form an isolation film.

In the aforementioned of a method for forming an isolation film in a semiconductor device according to another embodiment of the present invention, the cleaning process is performed using BFN (B[Piranha($H_2SO_4$+$H_2O_2$)]+F 50:1 Dilute HF)+N[SC-1($NH_4OH$/$H_2O_2$/$H_2O$)]) wherein a HF dip out time is 1 to 30 seconds.

In the aforementioned of a method for forming an isolation film in a semiconductor device according to another embodiment of the present invention, the method further comprises the step of performing a second cleaning process using CLN N (SC-1($NH_4OH$/$H_2O_2$/$H_2O$)) after the first cleaning process.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1A:
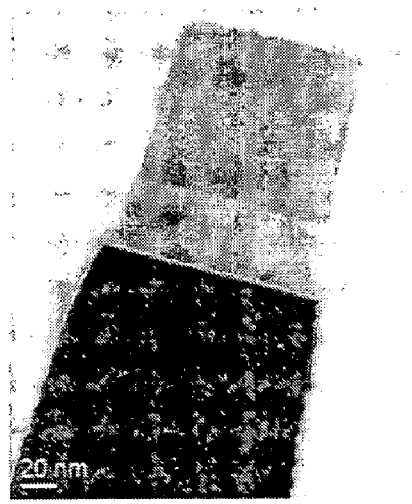
FIG. 1A and FIG. 1B are TEM photographs for explaining sidewall damage by a conventional process.
Figure 1B:
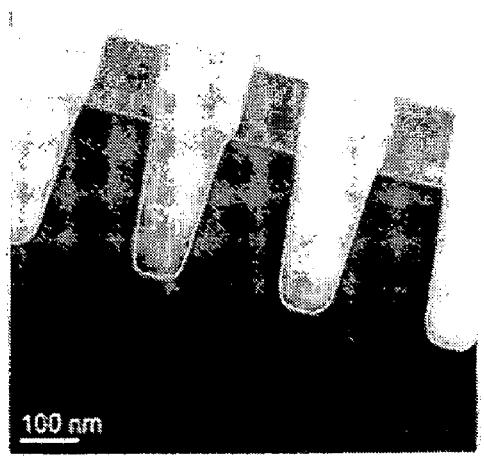
Figure 2:
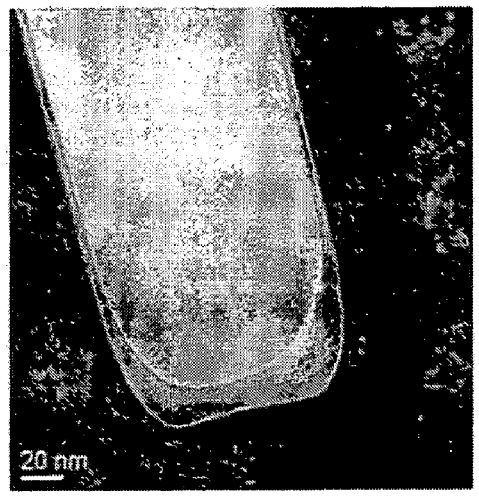
FIG. 2 is a TEM photograph showing that an abnormal layer of a carbon series is formed after a PET process in the related art.
Figure 3:
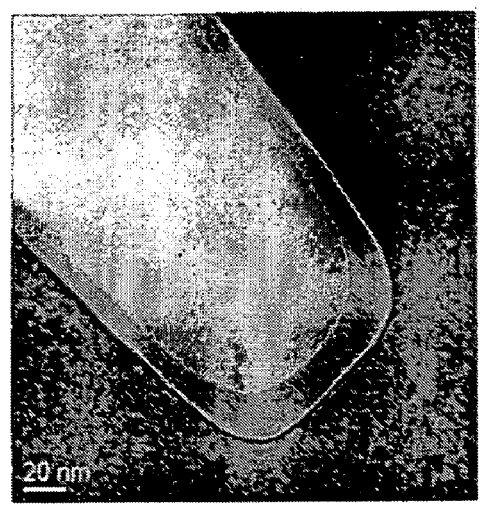
FIG. 3 is a TEM photograph for explaining the disparity of a sidewall oxide film in the related art.
Figure 4:
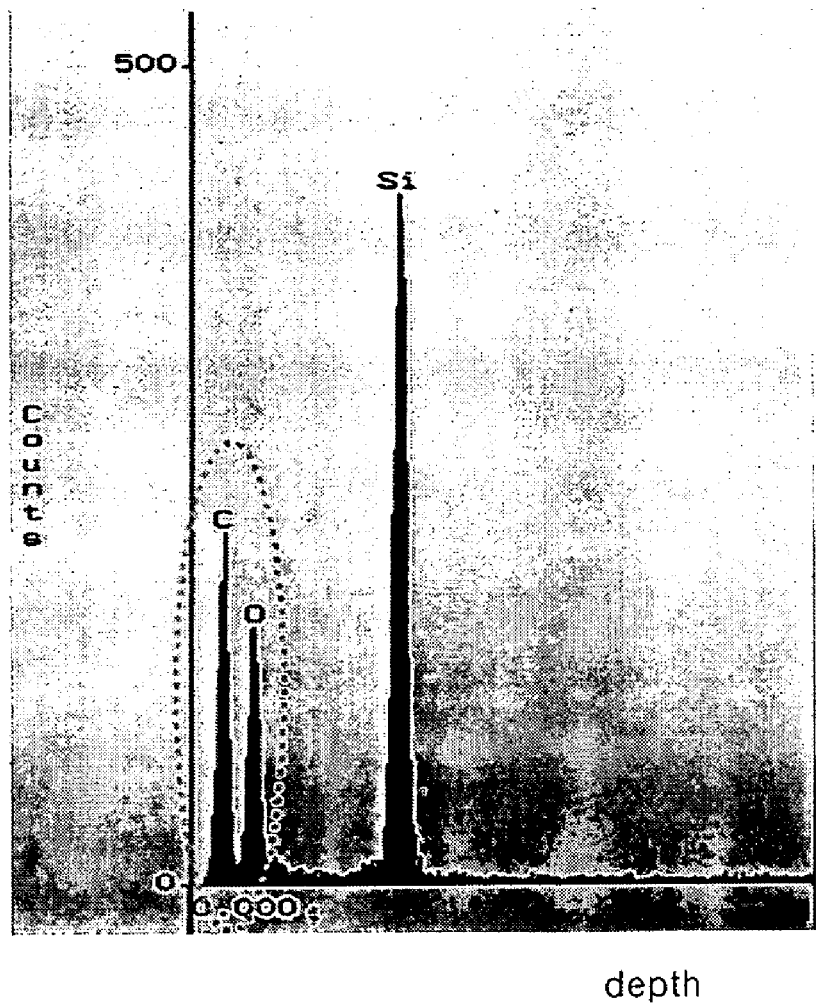
FIG. 4 shows a TEM EDS analysis table for a sidewall oxide film in the related art.

Now the preferred embodiments according to the present invention will be described in detail with reference to the accompanying drawings. Since preferred embodiments are provided for the purpose that the ordinary skilled in the art are able to understand the present invention, they may be modified in various manners and the scope of the present invention is not limited by the preferred embodiments described later. Like reference numerals are used to identify the same or similar parts.

FIG. 5A to FIG. 5D are cross-sectional views illustrating a method for forming an isolation film according to the present invention.

Figure 5A:
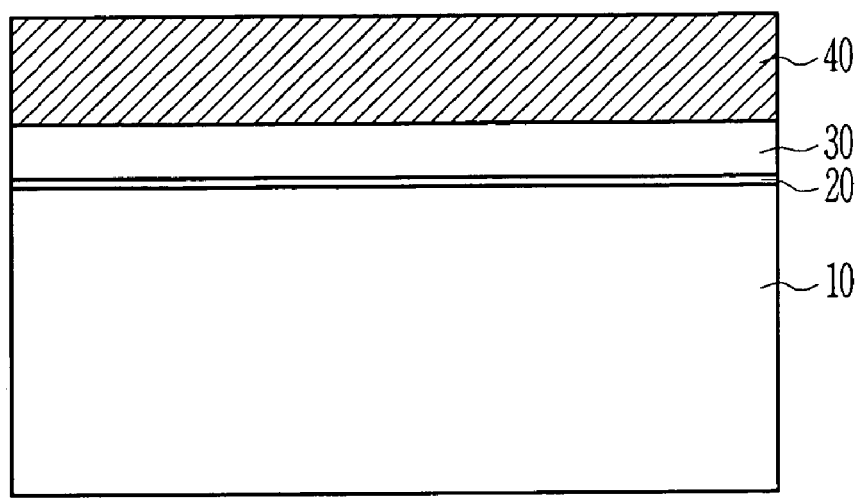
FIG. 5A to FIG. 5D are cross-sectional views illustrating a method for forming an isolation film according to the present invention.

Referring to FIG. 5A, an ion implantation process for forming a well and controlling the threshold voltage are performed on a semiconductor substrate 10, thus forming a well and an ion layer for controlling the threshold voltage (not shown). It is preferred that the well is a triple well including an N well and a P well.

A tunnel oxide film 20, a conductive film 30 and a hard mask film 40 are formed on the semiconductor substrate 10 in which the well and the ion layer for controlling the threshold voltage are formed.

In the above, before the tunnel oxide film 20 is deposited, a pre-treatment cleaning process may be implemented by using SC-1 (Standard Cleaning-1) composed of DHF (dilute HF) in which the mixing ratio of $H_2O$ and HF is 50:1, $NH_4OH$, $H_2O_2$ and $H_2O$, or SC-1 composed of BOE (buffered oxide etch) in which the mixing ratio of $NH_4F$ and HF is 100:1 to 300:1, $NH_4OH$, $H_2O_2$ and $H_2O$.

It is preferable that the tunnel oxide film 20 is formed by a dry or wet oxidizaion mode in thickness of 70 to 100 Å at a temperature of 750 to 850° C. after the cleaning process. After the tunnel oxide film 20 is formed, an annealing process using a $N_2O$ gas is performed at a temperature of 900 to 910° C. for 20 minutes and an annealing process using a $N_2$ gas is then performed. An interfacial defect density with the semiconductor substrate 10 is thus minimized.

It is preferred that the conductive film 30 is formed using a polysilicon film that will be used as a part of a floating gate by means of a subsequent process. It is preferable that the conductive film 30 is formed of an undoped thin amorphous silicon film having a thickness of 250 to 500 Å by using a $SiH_4$ gas or a $Si_2H_6$ gas by means of a low pressure CVD (LPCVD) method at a temperature of 500 to 550° C. and a pressure of 0.1 to 3.0 torr.

The hard mask film 40 is preferably formed using a material film of a nitride film series and protects a lower structure when the trench is etched later. It is preferred that the hard mask film 40 is formed using a nitride film having a thickness of 900 to 1200 Å by means of a LPCVD method.

Figure 6:
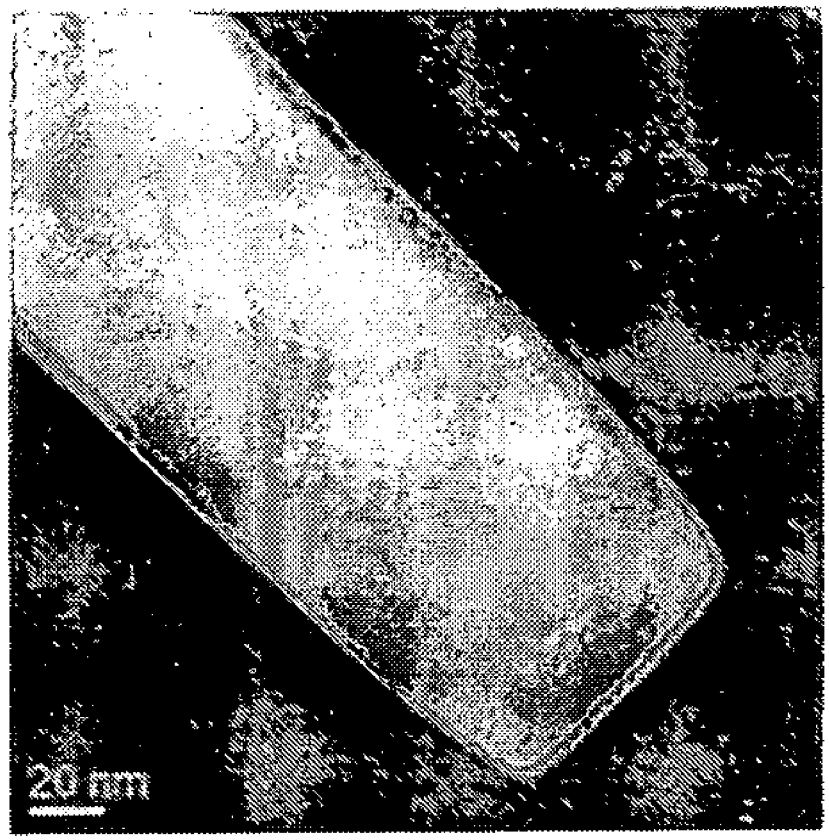
FIG. 6 is a TEM photograph after a trench for isolation is formed according to the present invention.

FIG. 6 is a TEM photograph after a trench for isolation is formed according to the present invention.

Figure 5B:
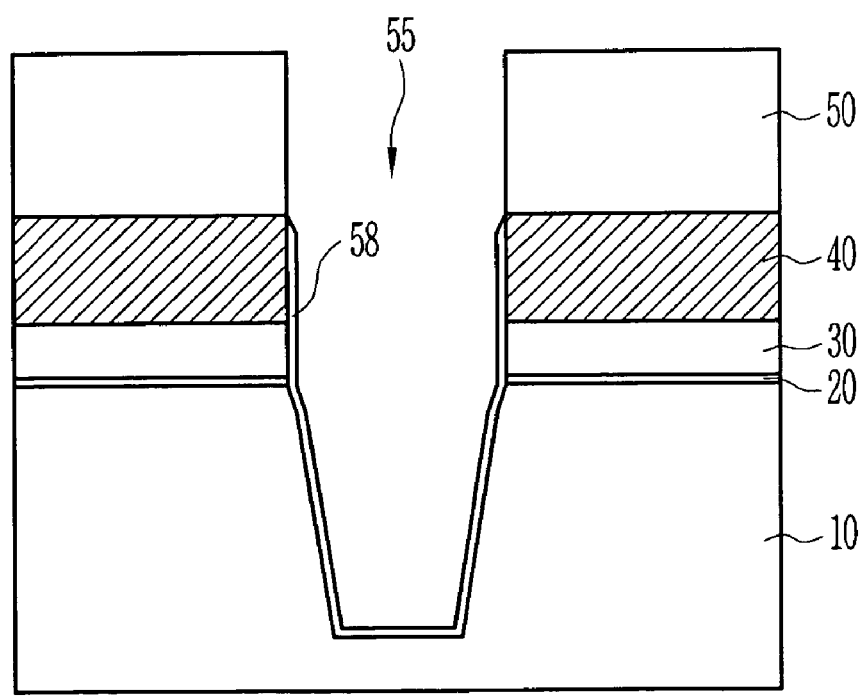

Referring to FIG. 5B and FIG. 6, after a photoresist pattern 50 for forming a trench 55 for isolation is formed, the hard mask film 40, the conductive film 30, the tunnel oxide film 20 and the semiconductor substrate 10 are sequentially etched by means of an etch process using the photoresist pattern 50 as an etch mask. Thereby, the trench 55 for isolation is formed.

In the above, it is preferred that a photoresist film of 3000 to 10000 Å in thickness is coated and the photoresist pattern 50 is then formed by performing a photograph etch process using a mask for isolation. The trench 55 is preferably formed to have a slope of a predetermined angle (80 to 88°). It is preferable that the top corner of the trench 55 has a tilt angle having a width of about 100 to 200 Å. At this time, a polymer film 58 is formed within the trench 55 (see FIG. 6).

Figure 5C:
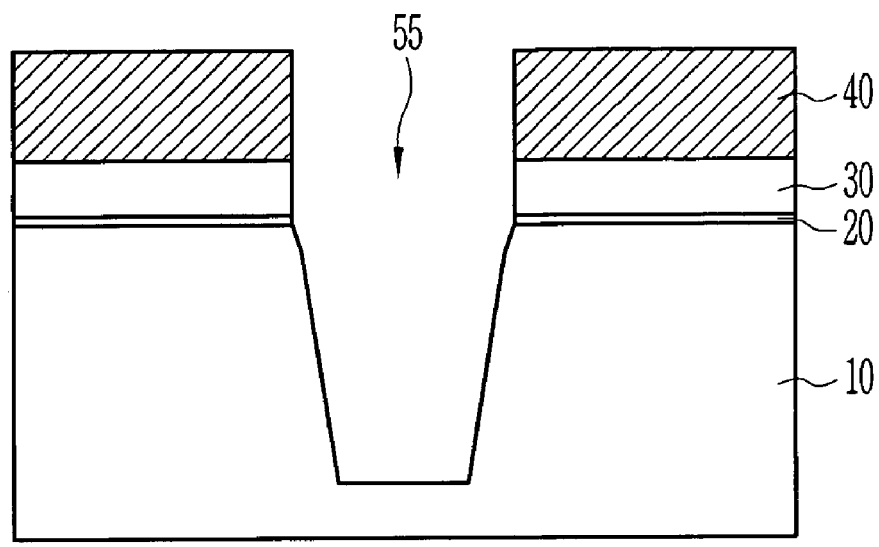

Referring to FIG. 5C, the photoresist pattern 50 is stripped by means of a predetermined strip process. A first cleaning process for stabilizing the roughness of the trench sidewall and stripping the remaining polymer film 58 is then performed.

It is preferred that the first cleaning process is performed using BFN (B[Piranha($H_2SO_4$+$H_2O_2$)]+F50:1 Dilute HF)+N[SC-1($NH_4.H/H_2O_2/H_2O$)]). It is preferable that in the first cleaning process using BFN, a first HF dip out time is minimized within 30 second (1 to 30 seconds). This is for protecting the semiconductor substrate 10 and the tunnel oxide film 20 exposed at the time of the cleaning process from being etched.

Figure 7A:
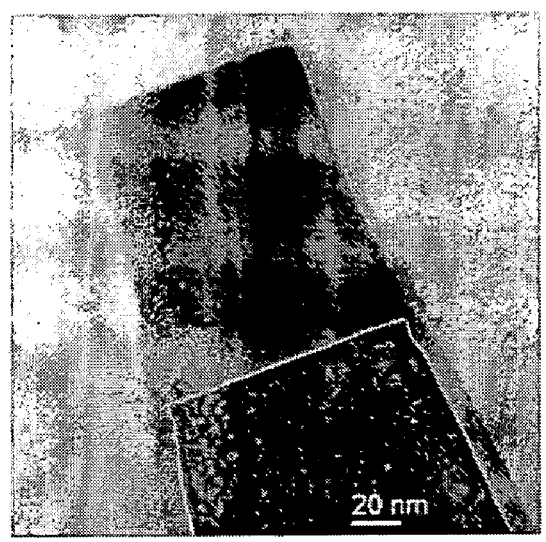
FIG. 7A is a TEM photograph at the top of the trench after oxidizing the sidewall and FIG. 7B is a TEM photograph at the bottom of the trench after oxidizing the sidewall.
Figure 7B:
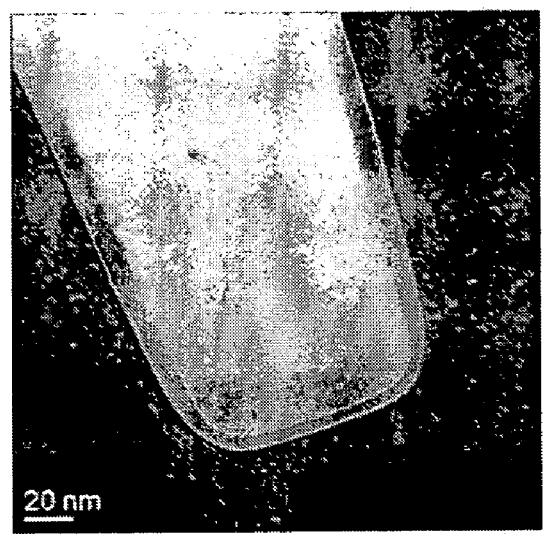

FIG. 7A is a TEM photograph at the top of the trench after oxidizing the sidewall and FIG. 7B is a TEM photograph at the bottom of the trench after oxidizing the sidewall.

Figure 5D:
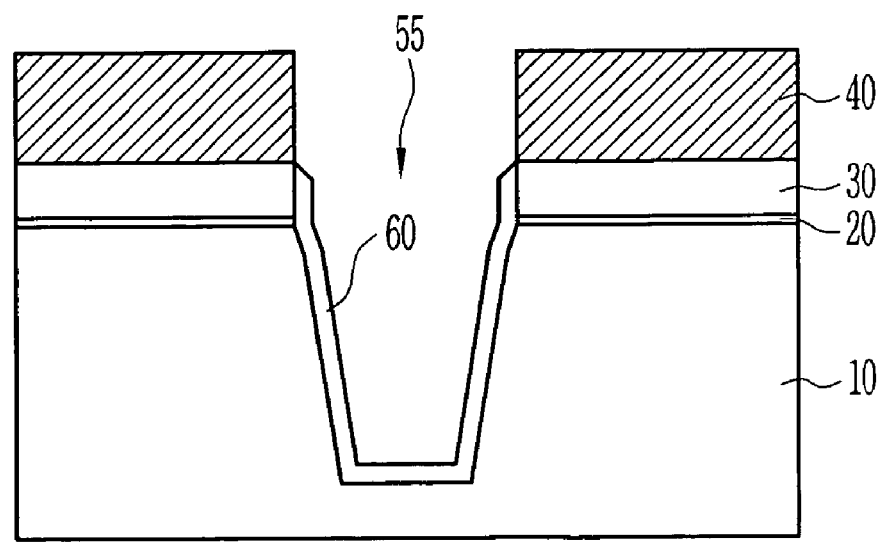

Referring to FIG. 5D, FIG. 7A and FIG. 7B, after a pre-treatment second cleaning process is performed, a sidewall oxidization process for compensating for the etch damage of the trench sidewall is carried out to form a sidewall oxide film 60. After a field oxide film is deposited on the entire structure, a polishing process using the hard mask film 40 as a stop layer is performed and an isolation film (not shown) is then formed by stripping the hard mask film 40.

It is preferred that the second cleaning process is performed using CLN N(SC-1($NH_4OH/H_2O_2/H_2O$)). It is effective to control the out-gassing of dopants that are already ion-implanted due to excessive exposure to HF dip out by performing the cleaning process using only SC-1, and to uniformly form the sidewall oxide film 60 through subsequent processes. After the pre-treatment cleaning process is performed, in order to compensate for the damage applied to the sidewall upon formation of the trench 55, make the top corner of the trench 55 rounded and reduce an active region critical dimension (CD), the sidewall oxidization process is performed to form the sidewall oxide film 60 having a uniform thickness of 30 to 100 Å (see FIG. 7A and FIG. 7B). Furthermore, the sidewall oxide film 60 is formed by performing the sidewall oxidization process in a dry or wet oxidization mode at a temperature of 700 to 900° C., so that out diffusion of the dopants already injected upon application of a high temperature process (over 1000° C., 1000 to 1100° C.) is controlled and the top corner of the trench 55 is rounded.

In the field oxide film, it is preferred that a HDP oxide film of 4000 to 6000 Å in thickness is formed on the entire structure in which the trench 55 is formed considering the margin of a subsequent polishing process. At this time, it is preferable that the inside of the trench 55 is fully filled so that an empty space is not formed therein. The polishing process preferably includes performing chemical mechanical polishing (CMP) using the hard mask film 40 as a stop layer. At this time, it is possible to control the height of the isolation film by adjusting a polishing target of the polishing process. After the polishing process is performed, the hard mask film 40 is stripped by a nitride film strip process using a phospohric acid ($H_3PO_4$) solution.

According to the present invention described above, after a trench for isolation is formed, a polymer film is stripped by a post cleaning process using BFN. A pre-treatment cleaning process using only SC-1 is performed and a sidewall oxidization process is then implemented. It is thus possible to improve degraded roughness characteristic of the trench sidewall and to easily strip polymer.

Furthermore, since a conventional PET process is omitted, an isolation film manufacturing process is simplified.

It is also possible to prohibit out-diffusion of dopants injected into a semiconductor substrate through a pre-treatment cleaning process using CLN N before a sidewall oxidization process.

Incidentally, by forming a slope at the top corner of a trench, it is possible to prevent a gate oxide film thinning phenomenon that the gate oxide film thinner than a desired thickness is deposited at the trench corner. It is also possible to improve electrical properties of a device by securing an active region as much as a target critical dimension.

What is claimed is:

1. A method for forming a trench for an isolation film, comprising the steps of:

forming an etching mask on a semiconductor substrate;

etching the semiconductor substrate to form a trench having a sidewall by an etch process using the etching mask;

performing a strip process for removing the etching mask;

performing a first cleaning process for removing byproducts generated during the etch process on a sidewall of the trench to improve the roughness of the sidewall by using BFN (B(Piranha($H_2SO_4+H_2O_2$))+F(50:1 Dilute HF)+N(SC-1($NH_4OH/H_2O_2/H_2O$))) after the step process for removing the etching mask;

performing a second cleaning process to uniformly form a sidewall oxide film through subsequent processes by using CLN (N(SC-1($NH_4OH/H_2O_2/H_2O$)); and performing a sidewall oxidation process to form a sidewall oxide film in the trench.

2. A method for forming an isolation film in a semiconductor device, comprising the steps of:

sequentially forming a tunnel oxide film, a conductive film and a hard mask film on a semiconductor substrate;

forming a photoresist pattern on the hard mask film, through which an isolation region is opened;

forming a trench having a sidewall by etching the hard mask film, the conductive film, the tunnel oxide film and the semiconductor substrate by an etch process using the photoresist pattern as an etch mask;

stripping the photoresist pattern;

performing a first cleaning process for removing a polymer film, which is generated during the etch process for forming the trench, on a sidewall of the trench to improve the stabilization of the roughness of the sidewall;

performing a second cleaning process to uniformly form a sidewall oxide film through subsequent processes after the first cleaning process;

performing a sidewall oxidation process to form a sidewall oxide film on the sidewall of the tunnel oxide film, conductive film and within the trench; and depositing a field oxide film on the entire structure, performing a polishing process using the hard mask film as a stop layer and then stripping the hard mask film to form the isolation film.

3. The method as claimed in claim 2, comprising performing the first cleaning process using BFN (B(Piranha ($H_2SO_4+H_2O_2$))+F(50:1 Dilute HF)+N (SC-1($NH_4OH/H_2O_2/H_2O$))), with a HF dip out time of 1 second to 30 seconds.

4. The method as claimed in claim 1, performing the second cleaning process using CLN N(SC-1($NH_4OH/H_2O_2/H_2O$)).

5. The method as claimed in claim 1, wherein the etching mask is formed of photoresist pattern.

6. The method as claimed in claim 1, comprising a HF dip out time of 1 second to 30 seconds.

7. The method as claimed in claim 1, comprising forming the trench to have a slope of a predetermined angle and forming a top corner of the trench to have a tilt angle having a width of about 100 Å to 200 Å.

8. The method as claimed in claim 1, comprising performing the sidewall oxidation process in a dry oxidation mode or a wet oxidation mode at a temperature of 700° C. to 900° C. and rounding a top corner of the trench.

9. The method as claimed in claim 2, comprising forming the trench to have a slope of a predetermined angle and forming a top corner of the trench to have a tilt angle having a width of about 100 Å to 200 Å.

10. The method as claimed in claim 2, comprising performing the sidewall oxidation process in a dry oxidation mode or a wet oxidation mode at a temperature of 700° C. to 900° C. and rounding a top corner of the trench.

* * * * *